(12) United States Patent
Ghyselen et al.

(10) Patent No.: US 11,373,897 B2
(45) Date of Patent: Jun. 28, 2022

(54) METHOD FOR MANUFACTURING A FILM ON A SUPPORT HAVING A NON-FLAT SURFACE

(71) Applicant: Soitec, Bernin (FR)

(72) Inventors: Bruno Ghyselen, Seyssinet (FR); Jean-Marc Bethoux, La Buisse (FR)

(73) Assignee: Soitec, Bernin (FR)

( * ) Notice: Subject to any disclaimer, the term of this patent is extended or adjusted under 35 U.S.C. 154(b) by 4 days.

(21) Appl. No.: 16/759,990

(22) PCT Filed: Oct. 31, 2018

(86) PCT No.: PCT/EP2018/079797
§ 371 (c)(1),
(2) Date: Apr. 28, 2020

(87) PCT Pub. No.: WO2019/086504
PCT Pub. Date: May 9, 2019

(65) Prior Publication Data
US 2020/0303242 A1  Sep. 24, 2020

(30) Foreign Application Priority Data
Oct. 31, 2017 (FR) ...................................... 1760270

(51) Int. Cl.
*H01L 21/762* (2006.01)
*H01L 41/313* (2013.01)

(52) U.S. Cl.
CPC ...... *H01L 21/76254* (2013.01); *H01L 41/313* (2013.01)

(58) Field of Classification Search
CPC ................................................ H01L 21/76254
See application file for complete search history.

(56) References Cited

U.S. PATENT DOCUMENTS

| | | |
|---|---|---|
| 5,494,835 A | 2/1996 | Burel |
| 5,949,108 A | 9/1999 | Doyle |
| 6,562,127 B1 | 5/2003 | Kub et al. |
| 2005/0009296 A1 | 1/2005 | Ghyselen et al. |
| 2005/0124142 A1 | 6/2005 | Bower |
| 2006/0019476 A1* | 1/2006 | Lagahe ............. H01L 21/76254 438/514 |

(Continued)

FOREIGN PATENT DOCUMENTS

| | | |
|---|---|---|
| FR | 3041364 A1 | 3/2017 |
| JP | 9145481 A | 5/1999 |

OTHER PUBLICATIONS

International Search Report for International Application No. PCT/EP2018/079797 dated Jan. 11, 2019, 3 pages.

(Continued)

*Primary Examiner* — Jae Lee
(74) *Attorney, Agent, or Firm* — TraskBritt

(57) ABSTRACT

A method for manufacturing a film on a support having a non-flat surface comprises: providing a donor substrate having a non-flat surface, forming an embrittlement zone in the donor substrate so as to delimit the film to be transferred, forming the support by deposition on the non-flat surface of the film to be transferred, and detaching the donor substrate along the embrittlement zone, so as to transfer the film onto the support.

22 Claims, 9 Drawing Sheets

(56) References Cited

U.S. PATENT DOCUMENTS

2009/0149005 A1  6/2009  Tauzin et al.
2018/0182661 A1  6/2018  Ghyselen

OTHER PUBLICATIONS

International Written Opinion for International Application No. PCT/EP2018/079797 dated Jan. 11, 2019, 5 pages.
European Communication pursuant to Article 94(3) EPC for European Application No. 18795628.9, dated Feb. 8, 2022, 7 pages.

\* cited by examiner

METHOD FOR MANUFACTURING A FILM ON A SUPPORT HAVING A NON-FLAT SURFACE

CROSS-REFERENCE TO RELATED APPLICATIONS

This application is a national phase entry under 35 U.S.C. § 371 of International Patent Application PCT/EP2018/079797, filed Oct. 31, 2018, designating the United States of America and published as International Patent Publication WO 2019/086504 A1 on May 9, 2019, which claims the benefit under Article 8 of the Patent Cooperation Treaty to French Patent Application Serial No. 1760270, filed Oct. 31, 2017.

TECHNICAL FIELD

The present disclosure relates to a method for manufacturing a film on a support having a non-flat surface.

BACKGROUND

The production of a film, notably monocrystalline, on a support is not easy to accomplish when the film has an interface surface with the support that is not flat, that is to say that the surface of the support comprises at least one curvature and/or a recessed or relief pattern.

This particular topology lends itself poorly to bonding and laminating methods, and the trend is generally toward techniques that involve forming the film by deposition on the support.

It is, however, necessary to ensure, apart from good mechanical strength of the film vis-à-vis the support, sufficiently good crystalline quality of the film. Yet, the crystalline quality of the film strongly depends on the support on which the deposition is performed and notably its surface. This is all the more true when monocrystalline films are to be formed by epitaxy. In this situation, the very nature of the support is particularly crucial due to the necessity of having an appropriate crystalline structure and lattice parameters suited to the film to be deposited. The list of candidates capable of playing the role of support becomes very limited, to the point in certain specification cases of not being able to find a solution.

BRIEF SUMMARY

One object of the present disclosure is thus to conceive a method for manufacturing a film on a support having a non-flat surface, while ensuring both good crystalline quality of the film and flexibility as to the nature of the support.

To this end, a method is disclosed for manufacturing a film on a support having a non-flat surface, wherein the method comprises:

the supply of a donor substrate having a non-flat surface,
the formation of an embrittlement zone in the donor substrate so as to delimit the film to transfer,
the formation of the support by deposition on the non-flat surface of the film to transfer, and
the detachment of the donor substrate along the embrittlement zone, so as to transfer the film onto the support.

According to one embodiment, the method further comprises the deposition of an intermediate layer on the non-flat surface before the deposition of the support.

The formation of the embrittlement zone is advantageously carried out by implantation of ionic species in the donor substrate.

The implanted ionic species may be hydrogen and/or helium.

According to one embodiment, the detachment of the donor substrate is caused by a heat treatment.

In this case, the deposition of the support is advantageously implemented with a thermal budget lower than that of the detachment heat treatment.

The transferred film may be made of a material selected from semiconductor materials, piezoelectric materials, magnetic materials and functional oxides.

In a particularly advantageous manner, the transferred film is monocrystalline.

The thickness of the transferred film is generally comprised between 100 nm and 10 µm, preferably between 100 nm and 1 µm.

The support may be made of a material selected from metals, glasses and ceramics.

The support typically has a thickness comprised between 1 and 50 µm.

Preferably, the material of the support is chosen to have a difference in thermal coefficient vis-à-vis the material of the transferred film less than $5\times10^{-6}$ $K^{-1}$ in absolute value.

The deposition of the support may be implemented by one of the following techniques: physical vapor deposition, chemical vapor deposition, electrochemical deposition, spin coating, lacquering and spraying.

According to one embodiment of the disclosure, the surface of the film to transfer has at least one curved portion.

According to one embodiment of the disclosure, the surface of the film to transfer has at least one recessed or relief pattern.

According to one embodiment of the disclosure, the surface of the film to transfer has a texture characterized by a roughness greater than 1 nm rms.

According to one embodiment, the non-flat surface of the film to transfer is obtained (for example, by etching of the donor substrate) after the formation of the embrittlement zone.

According to one embodiment, the non-flat surface of the film to transfer is obtained (for example, by etching of the donor substrate) before the formation of the embrittlement zone.

The residue of the donor substrate at the end of the detachment may be recycled with a view to the implementation of a new film having a non-flat surface on a support; before the recycling, the residue of the donor substrate is subjected to an operation of regeneration of its surface involving a removal of material that is substantially zero or conforming to the topology of the residue.

According to one embodiment, the donor substrate comprises a plurality of pads laid out on the surface of a wafer, each pad comprising an embrittlement zone delimiting a respective film to transfer, and the support is deposited on the surface of the whole of the pads.

According to a particular embodiment, the deposition of the support includes the successive deposition of at least two layers of different materials.

According to one embodiment, the method comprises, after the detachment of the donor substrate, the deposition of an additional film on the face of the transferred film opposite to the support.

Another object relates to an intermediate structure obtained after deposition of the support on the donor substrate. The structure comprises:

a donor substrate including an embrittlement zone delimiting a superficial film and
a support covering the film,
and the interface between the film and the support is not flat.

BRIEF DESCRIPTION OF THE DRAWINGS

Other characteristics and advantages of the disclosure will become clear from the detailed description that follows, with reference to the appended drawings, in which.

For reasons of legibility of the figures, the different elements are not necessarily represented to scale.

DETAILED DESCRIPTION

Generally speaking, the disclosure provides for the formation of the support by deposition on a non-flat donor substrate that has been embrittled beforehand so as to delimit a thin film. The thin film is next transferred onto the support by detachment of the donor substrate. The support may be constituted of a single material or a stack of at least two different materials, deposited successively on the donor substrate.

The non-planarity of the surface of the donor substrate may be due to a curvature (concave or convex) of at least one part of the surface, and/or to the presence of at least one recessed or relief pattern extending from the surface, and/or instead a surface texturing, whether voluntary or not.

Figure 1A:
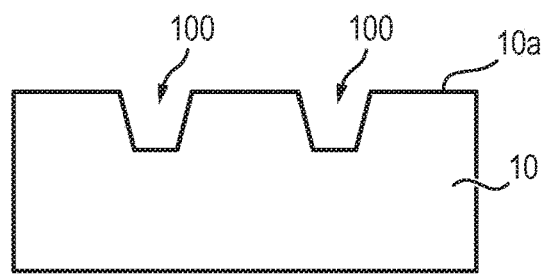
FIG. 1A is a schematic sectional view of a donor substrate comprising a surface having recessed patterns.

FIG. 1A illustrates a donor substrate 10 that comprises at least one superficial portion constituted of the material intended to form the thin film. Although the donor substrate is represented in the form of a bulk substrate, it could also be formed of a stack of different materials having a superficial layer constituted of the material intended to form the thin film. In particular, the thin film may correspond to a layer of this stack produced by epitaxy.

The surface 10a of the donor substrate 10 comprises a certain number of recessed patterns 100 (or relief patterns—not illustrated here) with respect to a reference plane.

The patterns may advantageously be formed by lithography and etching of the donor substrate. They may also, for example, be obtained by deposition using masks.

Advantageously, the material intended to form the thin film is selected from: semiconductor materials (for example, silicon, silicon carbide, germanium, III-V compounds such as AsGa, InP, GaN, II-VI compounds such as CdTe, ZnO), piezoelectric materials (for example, $LiNbO_3$, $LiTaO_3$, PZT, PMN-PT), magnetic materials and functional oxides (for example, $ZrO_2$, $SrTiO_3$, YSZ, $GaO_2$). These examples are not limiting.

Preferably, the material intended to form the thin film is monocrystalline. It may also be polycrystalline, and in this case emphasis is often placed on optimizing its conditions of formation in order to obtain, for example, a particular density and size of crystalline grains, and/or instead a preferential crystalline orientation, and/or an optimized roughness.

An embrittlement zone 11, which delimits a superficial film 12 intended to be transferred, is formed in the donor substrate 10. Although envisaged here as carried out after the formation of the patterns, the formation of the embrittlement zone could be implemented before the formation of the patterns.

The thickness of the transferred film is defined by the depth of the embrittlement zone 11 in the donor substrate 10. Advantageously, this depth is between 100 nm and 10 µm, preferentially between 100 nm and 1 µm.

The formation of the embrittlement zone 11 in the donor substrate 10 may be carried out by implantation of ionic species (shown schematically by the arrows in FIG. 1B) through the surface 10a of the substrate. Advantageously, the implanted species are hydrogen ions and/or helium ions. The implantation energy makes it possible to define the depth of the embrittlement zone 11. The implantation dose is chosen in order to enable the detachment of the film 12 after the application of a suitable treatment. The implantation dose is chosen sufficiently low so as not to induce the formation of bubbles as of the implantation step. The ionic species, the energy and the implantation dose are chosen as a function of the material of the donor substrate 10. These conditions have been the subject of numerous publications and are known in the art.

If the implantation is carried out through the surface already having recessed and/or relief patterns, the embrittlement zone may follow substantially the same profile as these patterns, and the thickness of material between the surface and the embrittlement zone may be substantially constant.

Figure 1B:
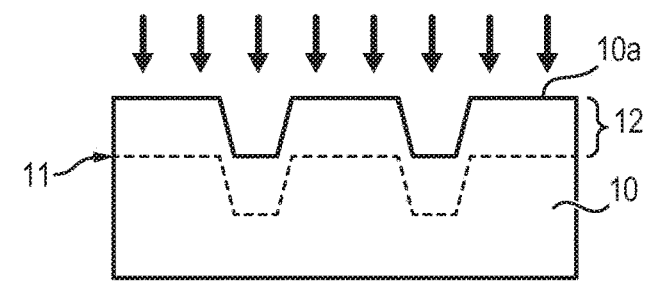
FIGS. 1B and 1C illustrate in a schematic manner two alternatives of an embrittlement zone formed in the donor substrate of FIG. 1A.
Figure 1C:
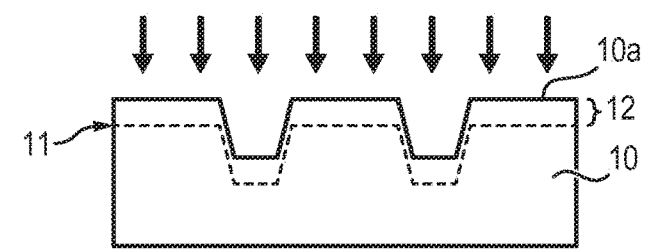

The continuity of the film and its quality in the vicinity of the transition zones between adjacent patterns may depend in particular on the thickness ratios between the thickness of the film and the amplitude of the relief. For a thick film (for example, 2 µm) and a low step (for example, 0.05 µm), the film 12 could appear substantially continuous, as represented in FIG. 1B. Conversely, for a thin film (for example, 0.05 µm) and a high step (for example, 2 µm), the film 12 will be likely to have discontinuities (cf. FIG. 1C), which is not necessarily disadvantageous depending on the targeted application. In certain situations, this phenomenon could be taken into account and it could preferably be ensured that the angle between the surface of the patterns and the surface of a reference plane is less than or equal to 45°.

Figure 2A:
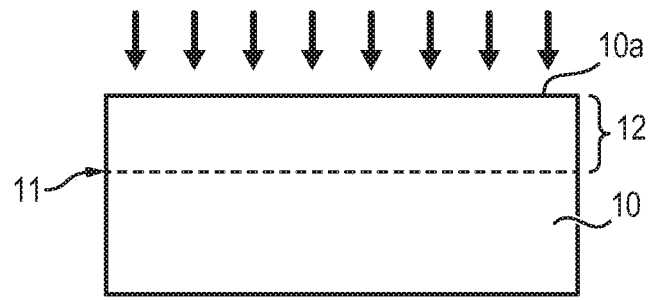
FIGS. 2A and 2B illustrate an alternative to FIGS. 1A and 1B, corresponding to a reversed order of the steps concerned.
Figure 2B:
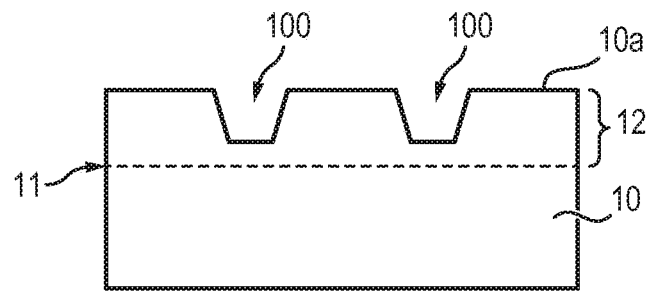

Alternatively (cf. FIG. 2A), if the implantation is carried out through a surface 10a of the donor substrate 10 that is initially flat, and the recessed and/or relief patterns are formed from this surface after the implantation as shown in FIG. 2B, the embrittlement zone is substantially flat. The etching of the patterns 100 may be carried out later such that the depth of etching is less than the depth of the embrittlement zone 11 (cf. FIG. 2B) if a discontinuity of the film 12 is not desired.

In order to take account of the fact that several topological levels may be brought into play with regard to the embrittlement planes, configurations where the embrittlement zone is not single but multiple and/or extended could be envisaged. In the case of an embrittlement by implantation, this could be done easily through a multiple or extended choice of implantation energies.

Figure 1D:
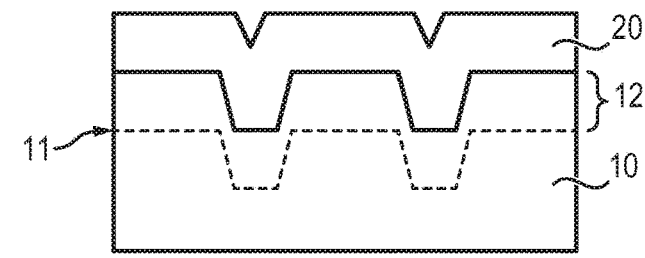
FIG. 1D illustrates in a schematic manner the support deposited on the donor substrate of FIG. 1B.

With reference to FIG. 1D, a support 20 is formed on the surface of the film 12 that, at this stage, still forms part of the donor substrate 10.

In contrast to bonding techniques, the support is not separate, previously formed structure, but instead is formed directly on the donor substrate. The following deposition techniques may be implemented for the formation of the support: physical vapor deposition (PVD), chemical vapor deposition (CVD), deposition by electrodeposition or electroforming, electroplating or electrochemical deposition (ECD), spin coating, lacquering and spraying. These techniques are known per se and will not be described in greater detail here, those skilled in the art being capable of selecting the technique the most suited as a function of the material of the support to deposit. Deposition techniques at relatively low temperature are preferred, in order not to initiate a premature detachment of the donor substrate.

Depending on the deposition technique chosen, the deposition may be conformal, that is to say that the free surface of the support substantially follows the same profile as the patterns, the thickness of material between the surface of the support and the surface of the donor substrate remaining substantially constant.

However, if the deposited thickness is important (for example, greater than or equal to 50 µm) with regard to the size of the topology (for example, a step of 0.5 µm), the deposited thickness could appear constant, and consequently the free surface of the support will appear flat.

According to other embodiments, the deposition may have the effect of filling the recesses present on the surface of the donor substrate, resulting in a free surface of the substantially flat support. In this case, the support has a variable thickness.

The support is advantageously made of a material selected from metals (for example, Ni, Cu, Cr, Ag, Fe, Co, Zn, Al, Mo, W and alloys thereof), glasses and ceramics (for example, silica ($SiO_2$), alumina ($Al_2O_3$), polycrystalline AlN, polycrystalline silicon, polycrystalline SiC). These examples are not limiting.

The thickness of the support is typically comprised between 1 and 50 µm (this thickness being sufficiently low so that the support can be assimilated with a sheet), but may also be much greater.

Furthermore, care is taken that the adherence of the support on the donor substrate is sufficient in order to avoid the detachment of the support during the film transfer method. This adherence may be improved by the deposition of an adhesion layer on the donor substrate before the deposition of the support. For example, the adhesion layer may be made of one of the following materials: Ti, Cr, Pt, Ta, TiW, $Si_3N_4$, TiN, CrCu.

Figure 1E:
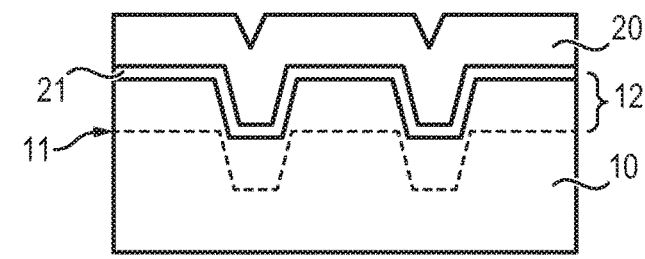
FIG. 1E illustrates an alternative structure of FIG. 1D, in which an intermediate layer has been deposited between the donor substrate and the support.

More generally, an adhesion layer 21 may be deposited on the film 12 before the deposition of the support 20 (the final structure being represented in FIG. 1E). Apart from a potential adhesion function, such a layer may notably have the function of avoiding the diffusion of chemical species to the film 12 during the deposition of the support 20, and/or to form an electrical contact on the film 12, and/or to form an optical index jump, and/or instead to minimize a discontinuity in acoustic impedance. Naturally those skilled in the art are capable of choosing the suitable material and its thickness according to the mechanical, electrical, optical, thermal, acoustic or chemical function of the intermediate layer.

The thickness of the intermediate layer 21 is sufficiently low so that the rigidity of this layer does not adversely affect the flexibility of the support, when this characteristic is important.

When a significant difference exists between the thermal expansion coefficients of the support and the film (typically a difference greater than $5 \times 10^{-6}$ $K^{-1}$), the material of the support is chosen to exhibit sufficient ductility such that the transferred film does not suffer damage (for example, of fissure type) during the transfer method. Sufficient ductility is understood to mean that the elastic limit of the support is less than the product of the elastic limit of the film and the thickness ratio between the film and the support.

Figure 1F:
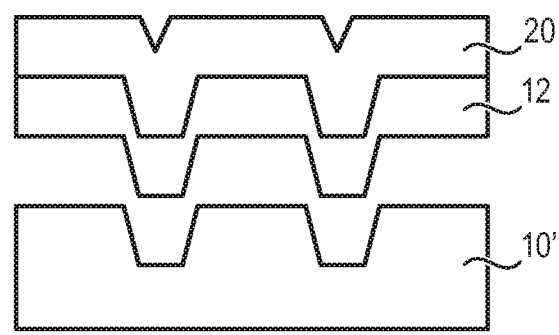
FIG. 1F illustrates in a schematic manner the structure resulting from the detachment of the donor substrate of FIG. 1E along the embrittlement zone.

With reference to FIG. 1F, the donor substrate 10 is then detached along the embrittlement zone 11, so as to transfer the film 12 onto the support 20. At the end of this detachment, a residue 10' of the donor substrate remains, which may potentially be recycled and reused.

The detachment is caused by a treatment of the stack of the support 20 on the donor substrate 10. The treatment may be, for example, thermal, mechanical or a combination of these two types of treatment. This type of treatment is well known notably within the context of the Smart Cut™ method and, thus, will not be described in detail here. In the case of a heat treatment, the thermal budget of this treatment is generally greater than the thermal budget of deposition of the support.

Figure 1G:
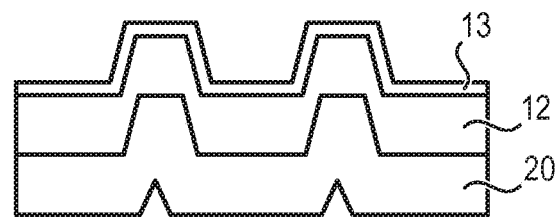
FIG. 1G illustrates in a schematic manner the structure of FIG. 1F after the deposition of an additional film on the transferred film.

The film 12 may potentially serve as a seed layer for the deposition of an additional film 13 (cf. FIG. 1G).

The structure formed of the support 20 and the film 12 (and a potential additional film) may be used to form devices that notably have applications in microelectronics, photonics or optics. Such a structure may also be employed in the manufacture of sensors or transducers, or membranes for fuel cells.

FIGS. 3A to 3D schematically illustrate another embodiment of the transfer method, wherein the surface of the donor substrate has at least one concave or convex curvature.

The reference signs common with FIGS. 1A to 2B designate the same elements, which will thus not be described again in detail. In addition, the materials and methods described with reference to FIGS. 1A to 2B are also applicable to the embodiment of FIGS. 3A to 3D, such that they will not be described again in detail.

Figure 3A:
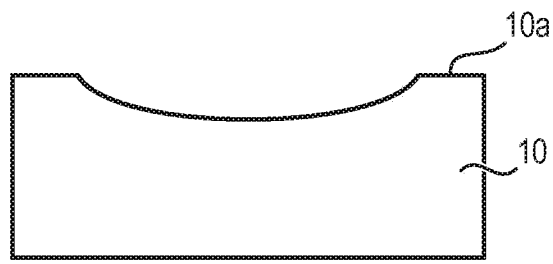
FIG. 3A is a schematic sectional view of a donor substrate comprising a curved surface.

With reference to FIG. 3A, the surface 10a of the donor substrate 10 is concave.

Figure 3B:
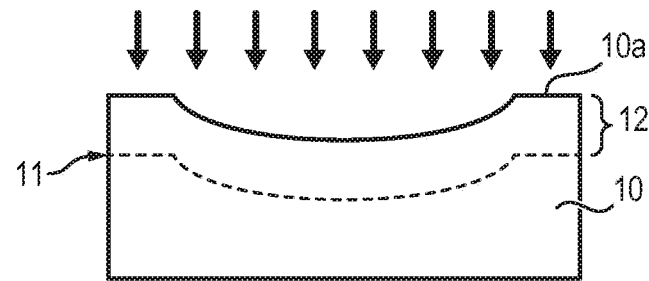
FIG. 3B illustrates in a schematic manner the formation of an embrittlement zone in the donor substrate of FIG. 2A.

With reference to FIG. 3B, an implantation of atomic species through the surface 10a has the effect of forming an embrittlement zone 11 within the donor substrate 10. The embrittlement zone generally has a curvature corresponding to the curvature of the surface of the donor substrate 10, the thickness of the film 12 to be transferred being substantially constant. As indicated previously, the surface of the donor substrate may be made concave or convex after the formation of the embrittlement zone, which is then generally flat.

Figure 3C:
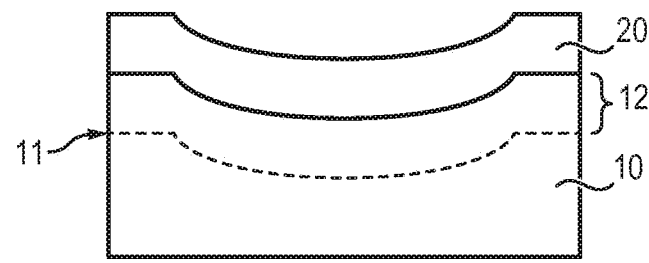
FIG. 3C illustrates in a schematic manner the deposition of the support on the donor substrate of FIG. 3B.

With reference to FIG. 3C, a support 20 is formed by deposition on the surface of the film 12, which still forms part of the donor substrate 10 at this stage. As indicated previously, the deposition of the support may be preceded by the deposition of an intermediate layer (not represented).

Depending on the deposition technique chosen, the deposition may be conformal. In other words, the free surface of the support may have substantially the same curvature as the donor substrate, and the thickness of material between the surface of the support and the surface of the donor substrate may be substantially constant.

Figure 3D:
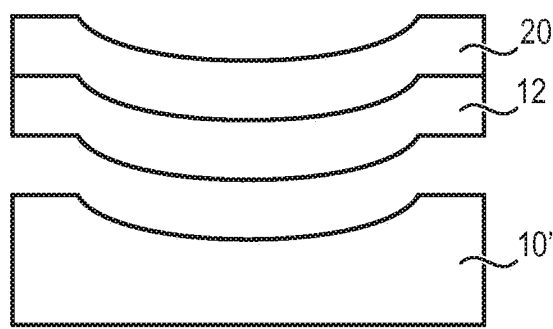
FIG. 3D illustrates in a schematic manner the structure resulting from the detachment of the donor substrate along the embrittlement zone.

With reference to FIG. 3D, the donor substrate 10 is then detached along the embrittlement zone 11, so as to transfer the film 12 onto the support 20. At the end of this detachment, a residue 10' of the donor substrate may remain, which can potentially be recycled and reused.

The method of FIGS. 3A to 3D may be employed for the formation of curved parts. They may be, for example, coatings of optical parts, such as divergent or convergent lenses or parabolic shaped mirrors. They may also be optical glasses for eye glasses or augmented reality glasses, or curved screens, or windscreen or cockpit elements, for example.

FIGS. 4A to 4D show in a schematic manner another embodiment of the transfer method, wherein the surface of the donor substrate has a textured topology. The topology may notably correspond to a roughness of the surface of the donor substrate, which may be formed intentionally or unintentionally.

Reference signs common with FIGS. 1A to 3D designate the same elements, which will not be described again in detail. In addition, the materials and methods described with reference to FIGS. 1A to 2B are also applicable to the embodiment of FIGS. 4A to 4D, such that they will not be described again in detail.

Figure 4A:
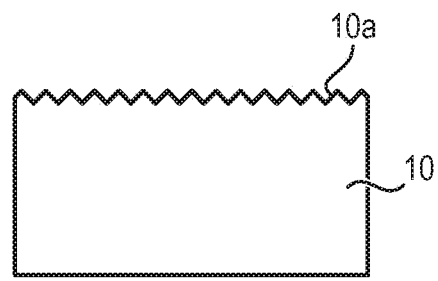
FIG. 4A is a schematic sectional view of a donor substrate comprising a textured surface.

With reference to FIG. 4A, the surface 10a of the donor substrate 10 has a certain roughness, for example, greater than or equal to 1 nm rms.

Figure 4B:
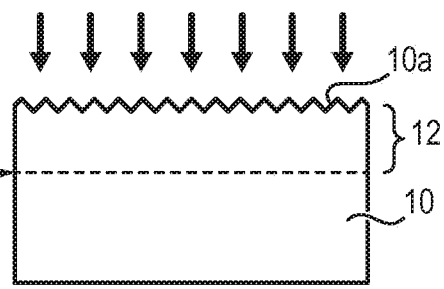
FIG. 4B illustrates in a schematic manner the formation of an embrittlement zone in the donor substrate of FIG. 4A.

With reference to FIG. 4B, an implantation of atomic species through the surface 10a has the effect of forming an embrittlement zone 11 within the donor substrate 10. As indicated previously, the surface of the donor substrate may potentially be textured after the formation of the embrittlement zone.

Figure 4C:
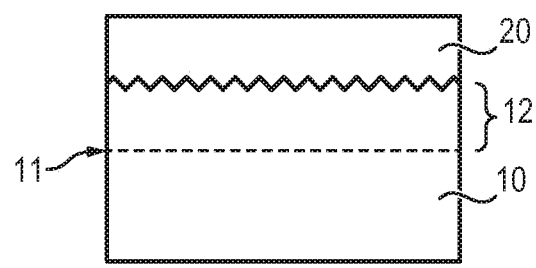
FIG. 4C illustrates in a schematic manner the deposition of the support on the donor substrate of FIG. 4B.

With reference to FIG. 4C, a support 20 is formed by deposition on the surface of the film 12, which still forms part of the donor substrate 10 at this stage. As indicated previously, the deposition of the support may be preceded by the deposition of an intermediate layer (not represented).

Depending on the deposition technique chosen, the deposition may be conformal. In other words, the free surface of the support has substantially the same texture as the donor substrate, and the thickness of material between the surface of the support and the surface of the donor substrate may be substantially constant.

Figure 4D:
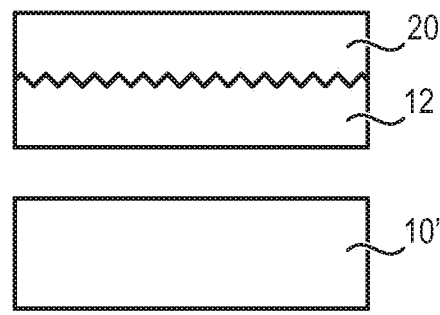
FIG. 4D illustrates in a schematic manner the structure resulting from the detachment of the donor substrate along the embrittlement zone.

With reference to FIG. 4D, the donor substrate 10 is then detached along the embrittlement zone 11, so as to transfer the film 12 onto the support 20. At the end of this detachment a residue 10' of the donor substrate remains, which may potentially be recycled and reused.

The method of FIGS. 4A to 4D may be employed, for example, to form acoustic wave structures such as radiofrequency (RF) filters, for example, and notably to avoid reflections of parasitic waves on the rear face of the substrates and/or layers considered.

Below are described several non-limiting examples of applications of methods according to the present disclosure.

Example 1: Formation of a Lithium Niobate Film on a Copper Sheet

Lithium niobate ($LiNbO_3$) is a piezoelectric and pyroelectric material remarkable in that it conserves its piezoelectric properties up to high temperatures. Its Curie temperature is 1140° C., whereas numerous other materials lose their properties at temperatures on the order of 100 to 250° C.

It thus represents an interesting material for systems exploiting piezoelectricity and/or pyroelectricity in these temperature ranges. For example, they may be systems for recovering energy by recovery of the energy of vibrations and other deformations of a mechanical system operating in a hostile environment at temperatures above 250° C. They may also be piezo or pyroelectric sensors dedicated to the measurement of temperature, pressure or to the detection of gas.

This material is monocrystalline and of good quality when it is produced by drawing out of ingots then cut into bulk wafers of several hundreds of μm thickness. In thin films, when they are produced by deposition, they are in general polycrystalline, at best quasi-monocrystalline but having high concentrations of defects.

Numerous targeted structures have to follow a certain topology, such as, for example, that of a structured floating beam or instead a floating platform, shifted or set back with respect to the average level of the surface of the substrate.

A $LiNbO_3$ substrate 10 is provided. Trenches 100 are produced by etching in the donor substrate 10 in order to define the contours of a future suspended membrane (cf. FIG. 1A). Typically the trenches have widths of several tens of μm and their depth is comprised between 0.1 and 0.5 μm.

Helium ions are implanted in the donor substrate 10 so as to form an embrittlement zone 11 and delimit a thin $LiNbO_3$ film 12 (cf. FIG. 1B). The thickness of the film 12 is of the order of 0.3 μm.

An adhesion layer 21 constituted of a Cr/Cu alloy is deposited on the film 12 by a PVD technique. A copper sheet support 20 is next deposited on the adhesion layer 21 by an electrochemical deposition technique (cf. FIG. 1E). The thickness of the sheet is on the order of 20 μm.

Next, an annealing is applied at a temperature of 300° C., in order to cause the detachment of the donor substrate 10 along the embrittlement zone 11.

Example 2: Formation of a Yttrium Stabilized Zirconia Film on a Nickel Sheet Yttrium stabilized zirconia (YSZ) is generally in the form of polycrystalline ceramic, and more rarely in the form of monocrystalline substrate.

One use of this material is based on its ion conduction properties. It then serves as solid membrane to play the role of electrolyte in SOFC (Solid Oxide Fuel Cell) systems. Such systems, when they have to be miniaturized (this is then known as micro-SOFC), have interest to evolve to membranes that are, on the one hand, thin, that is to say, typically below several μm thickness, and, on the other hand, monocrystalline. Such systems operate at high temperature (typically 550° C.-700° C.) and are subjected to strong thermomechanical loads. In order to make the membrane more resistant, it is advantageously given a corrugated shape thereby having a bellows topology, this shape making it possible to absorb deformations better by spring effect. Such a shaping may moreover have the beneficial effect of maximizing the exposed surface available for the desired electrochemical reactions.

Figure 7A:
FIGS. 7A-7G illustrate in a schematic manner the steps of a method according to another embodiment of the disclosure.
Figure 7B:
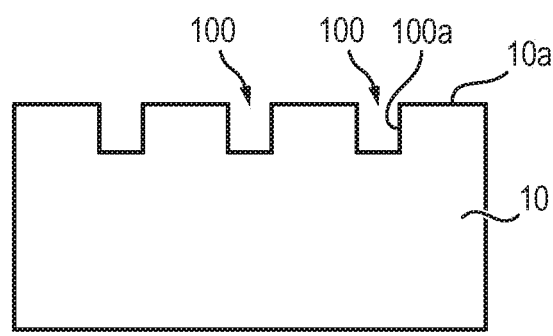

A monocrystalline YSZ substrate 10 (cf. FIG. 7A) is supplied. Networks of trenches 100 are produced by etching in the donor substrate 10 in order to define the contours of the future bellows of the electrolyte membrane (cf. FIG. 7B). Typically the trenches 100 have widths of several tens of μm and their depth is of the order of 2 μm. The sides 100*a* of the trenches, which will define the transition between the high zones and low zones of the bellows, are advantageously controlled to be inclined at more than 45° from the normal to the surface 10*a*. The trenches are spaced apart from each other by several tens of μm to form the desired corrugations.

Figure 7C:
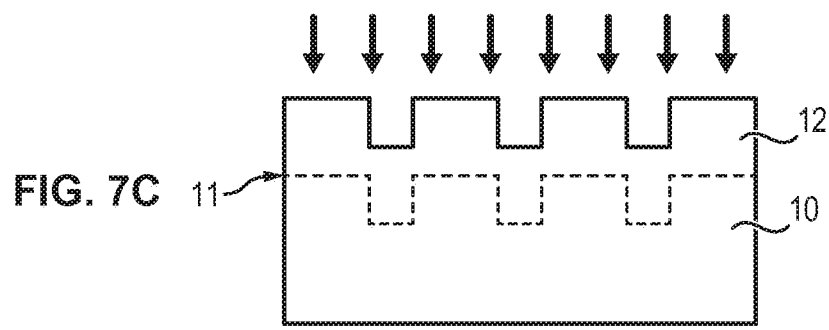

Hydrogen ions are implanted in the donor substrate 10 so as to form an embrittlement zone 11 and delimit a thin YSZ film 12 (cf. FIG. 7C). The thickness of the film 12 is of the order of 1 μm.

Figure 7D:
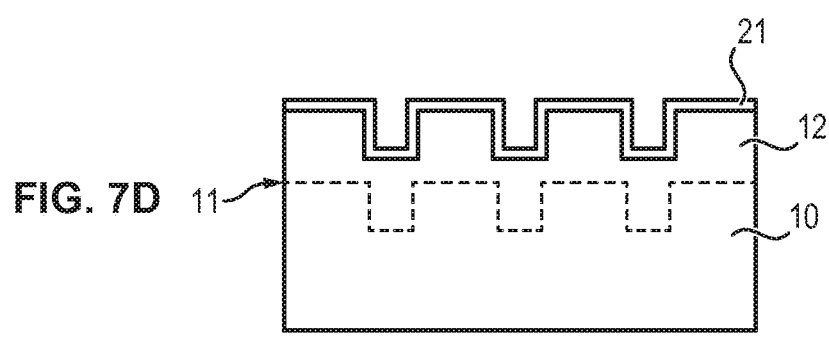
Figure 7E:
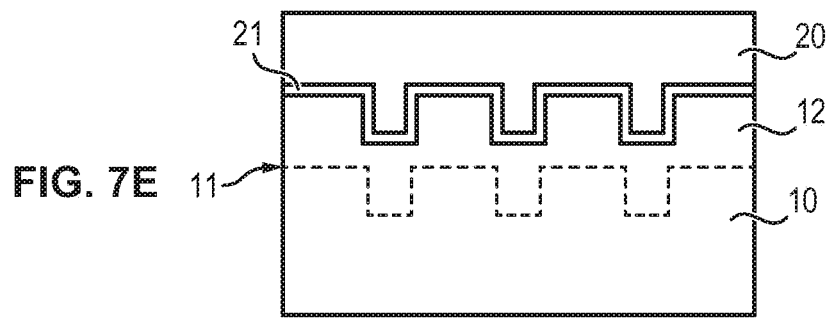

An adhesion layer 21 constituted of a Cr/Cu alloy is deposited on the film 12 by a PVD technique (cf. FIG. 7D). A nickel sheet support 20 is next deposited on the adhesion layer 21 by an electrochemical deposition technique (cf. FIG. 7E). The thickness of the sheet is of the order of 20 μm.

Figure 7F:
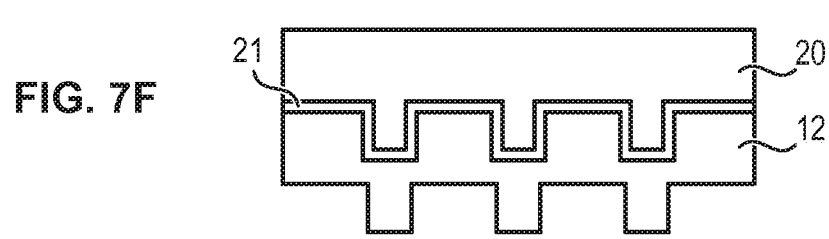

Next, an annealing is applied at a temperature of 300° C., in order to cause the detachment of the donor substrate 10 along the embrittlement zone 11 (cf. FIG. 7F).

Figure 7G:
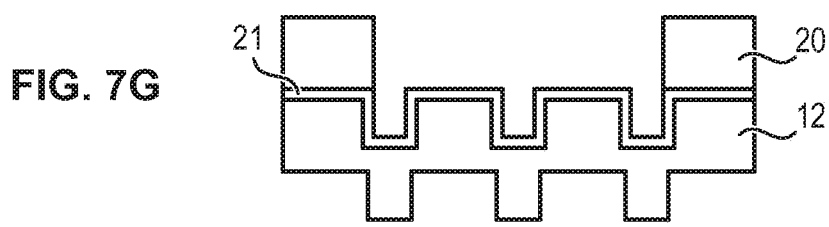

The support 20 may next be etched so as to obtain the final bellows shape (cf. FIG. 7G).

Example 3: Formation of a Monocrystalline Silicon Film on a Curved Glass Sheet In the field of the production of screens or other optical parts (lenses, mirrors, etc.), the production of non-flat or curved parts makes the use of thin films of monocrystalline materials such as silicon difficult. This example aims to make available a thin silicon film on a glass sheet having a certain curvature. This silicon film could notably serve to produce high performance transistors, for example, for the purposes of manufacturing high definition ultra-compact and curved screens.

A bulk monocrystalline silicon substrate 10 is provided.

Figure 5A:
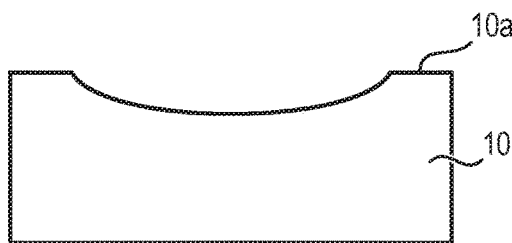
FIGS. 5A-5E illustrate in a schematic manner the steps of a method implemented according to one embodiment of the disclosure.

The curved shape that it is wished to follow is produced by etching in this silicon substrate. In the embodiment illustrated in FIG. 5A, the chosen shape is concave with a more marked rise on the edges. Any other profile—parabolic, elliptic, corrugated, etc.—is possible. This shape may be produced thanks to an etching by mechanical machining. Those skilled in the art will know how to adapt the etching technique the most suited to the desired shape and dimension.

Figure 5B:
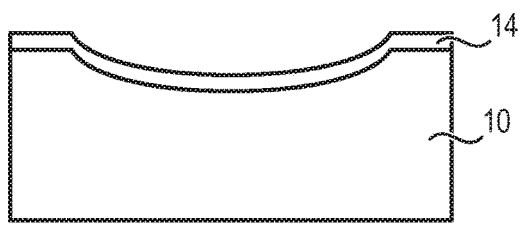

The donor substrate 10 is subjected to a thermal oxidation to produce a $SiO_2$ layer 14 of 0.2 μm thickness (cf. FIG. 5B).

Figure 5C:
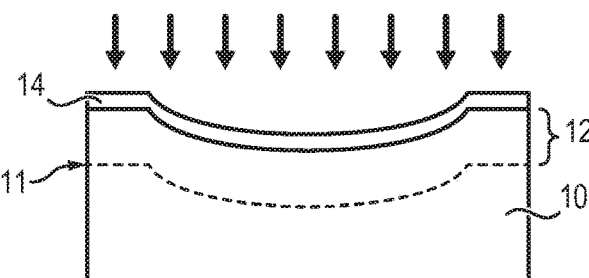

Hydrogen ions are next implanted in the donor substrate 10 through the oxide layer 14 so as to form an embrittlement zone 11 and delimit a thin film 12 of monocrystalline silicon (cf. FIG. 5C). The thickness of the film 12 is of the order of 0.5 μm.

Figure 5D:
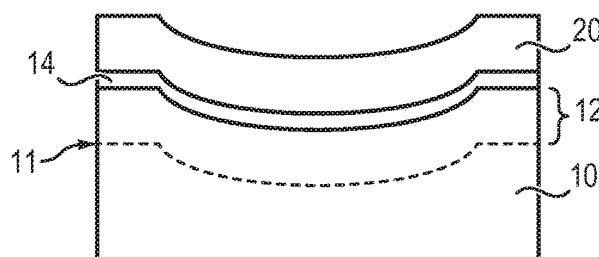

A support 20 made of silica (glass) is deposited on the film 12 by a deposition technique at low temperature, typically below 200° C. so as not to cause an untimely detachment along the embrittlement zone (cf. FIG. 5D). The thickness of the sheet is of the order of 20 μm. The doping of the silica, for example, using phosphorous or boron ions, makes it possible to better adjust the coefficient of thermal expansion of the glass to that of silicon in the case where high thermomechanical stresses were to appear. Those skilled in the art will know how to choose the doping level as well as the conditions and the deposition technique the most suited notably in terms of temperature and desired final thickness.

Figure 5E:
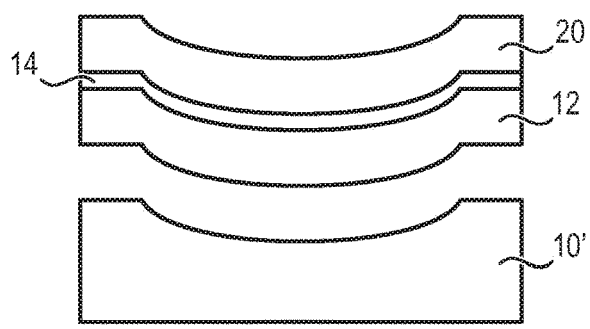

Next, an annealing is applied at a temperature of 500° C., in order to cause the detachment of the donor substrate 10 along the embrittlement zone 11 (cf. FIG. 5E).

Example 4: Formation of a Lithium Tantalate Film on a Glass Sheet

This example targets acoustic wave structures such as radiofrequency (RF) filters, for example. In certain RF structures it is sought to avoid reflections of parasitic waves on the rear face of the substrates and or layers considered. One means consists in making geometrically imperfect the interfaces and rear surfaces notably by introducing voluntary texturings or other roughnesses. This constraint is difficult or even impossible to satisfy if the use of certain thin films of monocrystalline materials such as $LiTaO_3$, for example, is envisaged, and this is so without resorting to the introduction of complex stacks of additional intermediate layers.

A bulk monocrystalline $LiTaO_3$ substrate 10 is supplied.

Figure 6A:
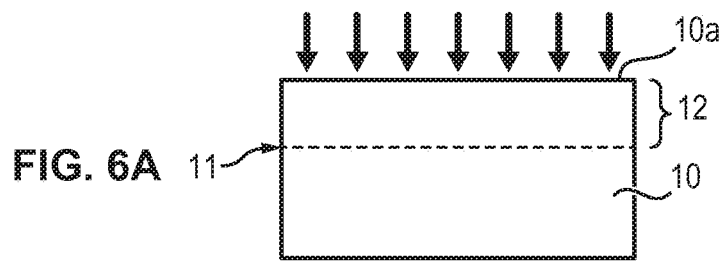
FIGS. 6A-6D illustrate in a schematic manner the steps of a method according to another embodiment of the disclosure.

Hydrogen ions are implanted in the donor substrate 10 through the surface 10*a* so as to form an embrittlement zone 11 and to delimit a thin film 12 of monocrystalline $LiTaO_3$ (cf. FIG. 6A). The thickness of the film 12 is of the order of 1.5 μm.

Figure 6B:
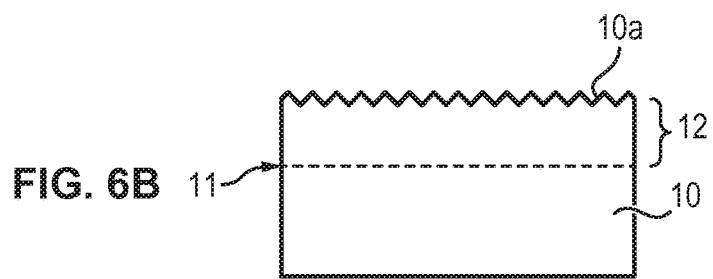

A texturing of the surface 10*a* is created by photolithoetching (cf. FIG. 6B). In this example the implantation takes place before the texturing step but is could take place after as in the embodiment illustrated in FIGS. 4A-4D.

Those skilled in the art will know how to adapt the technique the most suited to the shape and dimensions desired for the texture. It would be possible, for example, to choose a nanoimprint lithography technique to define patterns of characteristic slightly submicronic lateral dimensions, over a depth of the order of 0.05 μm. In one alternative, the texturing is obtained by roughening by cathodic sputtering effect. According to another alternative, implemented preferably before the implantation step, the texturing may be obtained by a sanding of the surface of the donor substrate 10.

Figure 6C:
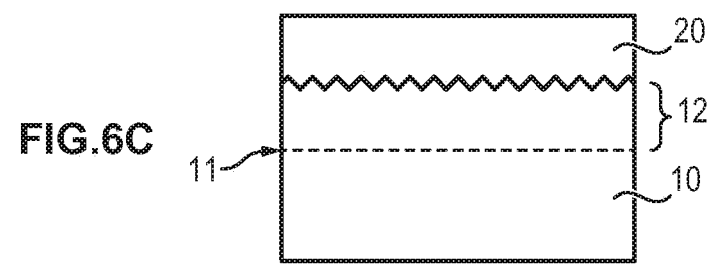

A support 20 made of silica is deposited on the film 12 by a deposition technique at low temperature, typically below 100° C. so as not to cause an untimely detachment along the embrittlement zone (cf. FIG. 6C). The thickness of the sheet is of the order of 10 µm. Those skilled in the art will know how to choose in these conditions the deposition technique the most suited notably in terms of temperature and desired final thickness. As an alternative, the support 20 may be made of metal instead of being made of silica.

Figure 6D:
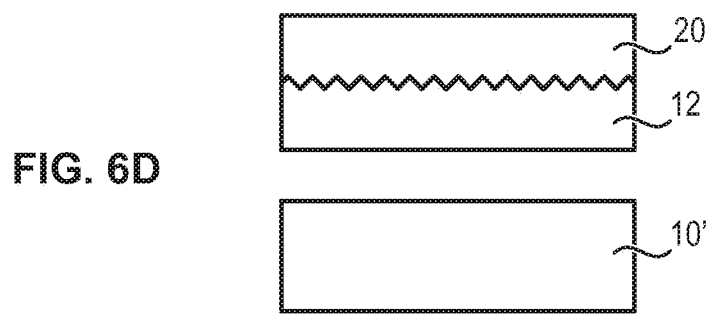

Next, an annealing is applied at a temperature of the order of 200° C., in order to cause the detachment of the donor substrate 10 along the embrittlement zone 11 (cf. FIG. 6D).

Example 5: Case of a Donor Substrate Comprising a Plurality of Pads

Figure 8A:
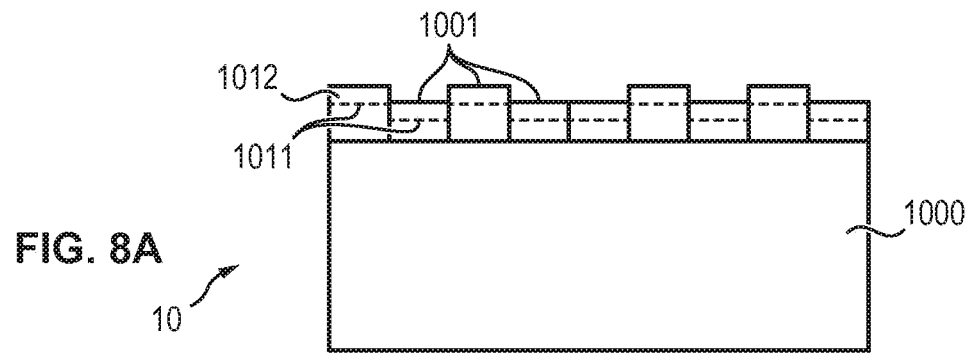
FIGS. 8A-8C illustrate in a schematic manner the steps of a method according to another embodiment of the disclosure.

According to one embodiment of the disclosure, the non-flat topology of the donor substrate results from the formation of a plurality of pads 1001 laid out on the surface of a wafer 1000 (cf. FIG. 8A).

The pads are advantageously formed of a material selected from semiconductor materials, piezoelectric materials, magnetic materials and functional oxides. The pads are advantageously monocrystalline. Each pad may be put in place on the wafer by bonding, individually or collectively.

The pads may have any appropriate size and shape as a function of the targeted application. The pads may be laid out in a regular manner on the wafer, for example, to form a sort of grid pattern.

The main surface of each pad 1001 is parallel to the main surface of the wafer 1000. However, in so far as the thickness of each pad is not controlled with sufficient precision, there may exist a slight difference in thickness from one pad to the next (for example, of the order of 1 or 2 µm thickness). As a result, the surface constituted of all of the surfaces of the pads has differences in levels, typically in the form of steps (the amplitude of these variations has been voluntarily exaggerated in FIG. 8A). These different steps thus form a non-flat topology of the surface of the wafer.

In general, as described, for example, in the documents FR 3 041 364 and U.S. Pat. No. 6,562,127, the pads are intended for the transfer of a superficial monocrystalline film onto a support final. To this end, an embrittlement zone 1011 is formed in each pad, before or after its putting in place on the wafer, to delimit a respective film 1012 to transfer, for example, by an implantation such as described above.

Figure 8B:
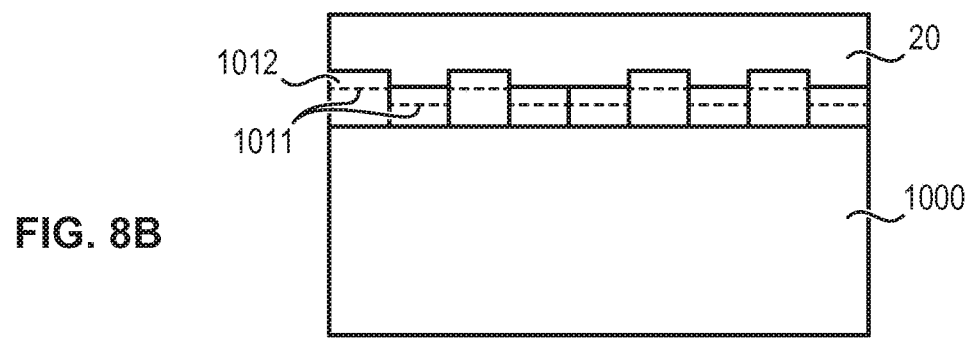

Unlike the methods described in the aforementioned documents, which involve bonding of the main face of each pad on the final support, the method of the present disclosure involves deposition of the support 20 on all of the pads laid out on the surface of the wafer (cf. FIG. 8B). One is thus free of problems of assembly linked to the difference in height of the different pads.

Figure 8C:
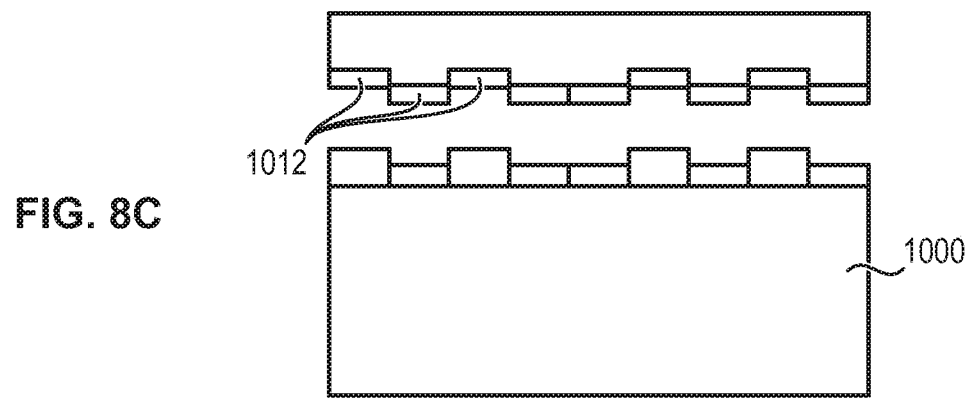

Next, each pad is detached along the respective embrittlement zone 1011, so as to transfer the corresponding film 1012 onto the support 20 (cf. FIG. 8c).

Whatever the embodiment considered, at the end of the detachment of the donor substrate a residue 10' remains.

If a recycling of the donor substrate is envisaged, it is possible to implement reconditioning operations, notably with the aim of regenerating the surface of the donor substrate that could have been damaged during the detachment. These operations may notably comprise steps of cleaning, etching, annealing, smoothing and planarization, for example, by polishing.

In the case where the formation of the topology of the donor substrate has taken place before the embrittlement step, the residue of the donor substrate has a topology identical to the initial topology of the donor substrate. It may appear advantageous for questions of cost to conserve this topology (curvature, and/or recessed pattern and/or texturing) that had been initially created in the donor substrate, with a view to avoiding having to reform it systematically after each recycling. In this case planarization methods are avoided, while favoring methods for removing material conformal in thickness, or even with substantially zero removal of material (that is to say below 30 nm), such as, for example, plasma etchings or smoothing annealings.

The invention claimed is:

1. A method for manufacturing a film on a support having a non-flat surface, the method comprising:
   providing a donor substrate having a non-flat surface;
   forming an embrittlement zone in the donor substrate so as to delimit the film to be transferred, wherein the surface of the film to be transferred is caused to be non-flat before forming the embrittlement zone;
   depositing the support on the non-flat surface of the film to be transferred; and
   detaching the donor substrate along the embrittlement zone so as to transfer the film onto the support.

2. The method according to claim 1, further comprising depositing an intermediate layer on the non-flat surface before depositing the support.

3. The method according to claim 1, wherein forming the embrittlement zone comprises implanting ionic species in the donor substrate.

4. The method according to claim 3, wherein the implanted ionic species comprise hydrogen and/or helium ions.

5. The method according to claim 4, wherein detaching the donor substrate comprises subjecting the donor substrate to a heat treatment.

6. The method according to claim 5, wherein depositing the support is performed with a thermal budget less than that of the heat treatment.

7. The method according to claim 1, wherein the transferred film comprises a material selected from the group consisting of: semiconductor materials, piezoelectric materials, magnetic materials and functional oxides.

8. The method according to claim 1, wherein the transferred film is monocrystalline.

9. The method according to claim 1, wherein a thickness of the transferred film is between 100 nm and 10 µm.

10. The method according to claim 1, wherein the support comprises a material selected from the group consisting of: metals, glasses and ceramics.

11. The method according to claim 1, wherein the support has a thickness between 1 µm and 50 µm.

12. The method according to claim 1, wherein the support comprises a material having a thermal expansion coefficient that differs from the material of the transferred film by less than $5 \times 10^{-6}$ $K^{-1}$ in absolute value.

13. The method according to claim 1, wherein depositing the support comprises at least one technique selected from among: physical vapor deposition, chemical vapor deposition, electrochemical deposition, spin coating, lacquering and spraying.

14. The method according to claim 1, wherein the non-flat surface of the film to be transferred has at least one curved portion.

15. The method according to claim 1, wherein the non-flat surface of the film to be transferred has at least one recessed or relief pattern.

16. The method according to claim 1, wherein the non-flat surface of the film to be transferred has a surface roughness greater than 1 nm rms.

17. The method according to claim 1, wherein a residue of the donor substrate after detaching the donor substrate is recycled and reused to form a new film having a non-flat surface on a support, and, before the recycling, the residue of the donor substrate is subjected to an operation of regeneration of its surface.

18. The method according to claim 1, wherein depositing the support comprises successive deposition of at least two layers of different materials.

19. The method according to claim 1, further comprising, after detaching the donor substrate, deposition of an additional film on a face of the transferred film opposite to the support.

20. The method according to claim 1, wherein the donor substrate comprises a plurality of pads laid out on a surface of a wafer, each pad comprising an embrittlement zone delimiting a respective film to be transferred, and depositing the support on a surface of each pad of the plurality of pads.

21. A method for manufacturing a film on a support having a non-flat surface, the method comprising:

provyiding a donor substrate having a non-flat surface, wherein the donor substrate comprises a plurality of pads laid out on a surface of a wafer;

forming an embrittlement zone in each pad so as to delimit a respective film to be transferred;

depositing the support on a surface of each pad of the plurality of pads; and detaching each pad along the embrittlement zone so as to transfer each respective film onto the support.

22. A method for manufacturing a film on a support having a non-flat surface, the method comprising:

providing a donor substrate having a non-flat surface, wherein the non-flat surface is created by etching or deposition;

forming an embrittlement zone in the donor substrate so as to delimit the film to be transferred;

depositing the support on the non-flat surface of the film to be transferred; and detaching the donor substrate along the embrittlement zone so as to transfer the film onto the support.

* * * * *